United States Patent
Kraus et al.

(10) Patent No.: US 8,524,581 B2
(45) Date of Patent: Sep. 3, 2013

(54) GAN EPITAXY WITH MIGRATION ENHANCEMENT AND SURFACE ENERGY MODIFICATION

(75) Inventors: Philip A. Kraus, San Jose, CA (US); Boris Borisov, Edina, MN (US); Thai Cheng Chua, Cupertino, CA (US); Sandeep Nijhawan, Los Altos, CA (US); Yoga Saripalli, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/339,695

(22) Filed: Dec. 29, 2011

(65) Prior Publication Data
US 2013/0171805 A1  Jul. 4, 2013

(51) Int. Cl.
*H01L 21/20* (2006.01)
*H01L 21/36* (2006.01)

(52) U.S. Cl.
USPC .... 438/503; 257/189; 257/615; 257/E33.049; 257/E21.085; 257/E21.097; 257/E21.108; 257/E21.117; 257/E21.365; 257/E21.398; 257/E21.405; 438/478; 438/481; 438/483; 438/507

(58) Field of Classification Search
USPC ............... 257/189, 615, E33.049, E21.085, 257/E21.097, E21.108, E21.117, E21.17, 257/E21.365, E21.398, E21.405; 438/481, 438/483, 478, 503, 507
See application file for complete search history.

(56) References Cited

U.S. PATENT DOCUMENTS

| | | | | |
|---|---|---|---|---|
| 8,143,147 | B1* | 3/2012 | Kraus et al. | 438/483 |
| 8,318,590 | B2* | 11/2012 | Kraus et al. | 438/483 |
| 2002/0006677 | A1* | 1/2002 | Egermeier et al. | 438/14 |
| 2007/0215036 | A1* | 9/2007 | Park et al. | 117/88 |
| 2010/0210067 | A1* | 8/2010 | Butcher | 438/99 |
| 2011/0136280 | A1* | 6/2011 | Bhat | 438/46 |
| 2011/0227037 | A1* | 9/2011 | Su | 257/13 |

* cited by examiner

*Primary Examiner* — Asok K Sarkar

(57) ABSTRACT

Methods and apparatus for depositing thin films incorporating the use of a surfactant are described. Methods and apparatuses include a deposition process and system comprising multiple isolated processing regions which enables rapid repetition of sub-monolayer deposition of thin films. The use of surfactants allows the deposition of high quality epitaxial films at lower temperatures having low values of surface roughness. The deposition of Group III-V thin films such as GaN is used as an example.

19 Claims, 9 Drawing Sheets

GAN EPITAXY WITH MIGRATION ENHANCEMENT AND SURFACE ENERGY MODIFICATION

FIELD OF THE INVENTION

The present disclosure relates generally to methods and apparatus for forming metal nitride films, such as epitaxial gallium nitride (GaN) films, and in particular to methods and apparatus for forming GaN films with migration enhancement and surface energy modification.

BACKGROUND OF THE INVENTION

The growth of high-quality crystalline semiconducting thin films is a technology of significant industrial importance, with a variety of microelectronic and optoelectronic applications, including light emitting diodes and lasers. The current state-of-the-art deposition technology for gallium nitride (GaN), indium nitride (InN) and aluminum nitride (AlN) thin films, their alloys and their heterostructures (collectively "InGaAlN" herein) is metal-organic chemical vapor deposition (MOCVD), in which a substrate is held at high temperature and gases which contain the elements comprising the thin film flow over and are incorporated into the growing thin film at the surface of the wafer. In the case of GaN, the state-of-the-art may include growth temperatures of approximately 1050° C. and the simultaneous use of ammonia ($NH_3$) and a Group III alkyl precursor gas (e.g., trimethylgallium, triethylgallium).

While methods exist for forming InGaAlN films, there are limitations associated with current methods. First, the high processing temperature involved in MOCVD may require complex reactor designs and the use of refractory materials and only materials which are inert at the high temperature of the process can be used in the processing volume. Second, the high temperature involved may restrict the possible substrates for InGaAlN growths to substrates which are chemically and mechanically stable at the growth temperatures and chemical environment, typically sapphire or silicon carbide substrates. Notably, silicon substrates, which are less expensive and are available in large sizes for economic manufacturing, may be less compatible. Third, the expense of the process gases involved as well as their poor consumption ratio, particularly in the case of ammonia, may be economically unfavorable for low cost manufacturing of InGaAlN based devices. Fourth, the use of carbon containing precursors (e.g., trimethylgallium) may result in carbon contamination in the InGaAlN film, which may degrade the electronic and optoelectronic properties of the InGaAlN based devices. Fifth, MOCVD reactors may have a significant amount of gas phase reactions between the Group III and the Group V containing process gases. The gas phase reactions may result in undesirable deposition of the thin film material on all surfaces within the reaction volume, and in the undesirable generation of particles. The latter may result in a low yield of manufactured devices. The former may result in a number of practical problems, including reducing the efficacy of in-situ optical measurements of the growing thin film due to coating of the internal optical probes and lens systems, and difficulty in maintaining a constant thermal environment over many deposition cycles as the emissivity of reactor walls will change as deposition builds up on the reactor walls. These problems may be common to all the variants of MOCVD, including plasma enhanced MOCVD and processes typically referred to as atomic layer deposition (ALD) or atomic layer epitaxy (ALE).

Other methods for forming InGaAlN thin films include plasma-assisted molecular beam epitaxy (PAMBE), in which fluxes of evaporated Ga, In, or Al are directed in high vacuum at a heated substrate simultaneously with a flux of nitrogen radicals (either activated molecular nitrogen, atomic nitrogen, or singly ionized nitrogen atoms or molecules) from a nitrogen plasma source. The method may be capable of producing high quality InGaAlN thin films and devices, but the method may suffer from a tendency to form metal agglomerations, e.g., nano- to microscopic Ga droplets, on the surface of the growing film. See, for example, "Homoepitaxial growth of GaN under Ga-stable and N-stable conditions by plasma-assisted molecular beam epitaxy", E. J. Tarsa et al., J. Appl. Phys 82, 11 (1997), which is entirely incorporated herein by reference. As such, the process may need to be carefully monitored, which may inherently result in a low yield of manufactured devices.

Other methods employed to make GaN films include hydride vapor phase epitaxy, in which a flow of HCl gas over heated gallium results in the transport of gallium chloride to a substrate where simultaneous exposure to ammonia results in the growth of a GaN thin film. The method may require corrosive chemicals to be used at high temperatures, which may limit the compatible materials for reactor design. In addition, the byproducts of the reaction are corrosive gases and solids, which may increase the need for abatement and reactor maintenance. While the method may produce high quality GaN films at high growth rates (tens to hundreds of microns per hour have been demonstrated, exceeding those commonly achieved with MOCVD), the reactor design and corrosive process inputs and outputs are drawbacks.

One approach being considered to lower the cost of manufacturing of InGaAlN thin films and devices is to develop methods that lower the energy barrier for surface diffusion (herein referred to as the "surface energy") of species involved in the growth of the film, thereby allowing high quality films to be formed at lower temperatures. Therefore, there is a need to develop methods and apparatus for delivering beneficial species that lower the surface energy for adatom diffusion on the growth front of InGaAlN thin films in a cost effective manner.

SUMMARY OF THE DISCLOSURE

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments of the present invention, surfactants are disposed on the surface during the growth of a thin film wherein the surfactants lower the surface energy and increases the lateral diffusion of species involved in the growth of the film. The deposition of a Group III-V film such as GaN is used as a non-limiting example. In some embodiments of the present invention, apparatus are provided that allow the investigation of the influence of the surfactant on the growth of the film in a combinatorial manner.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIG. 6 presents a graph of the calculated reflectivity for a bare sapphire substrate, a GaN layer, and a GaN layer with 2 ML of In.

DETAILED DESCRIPTION

Figure 1:
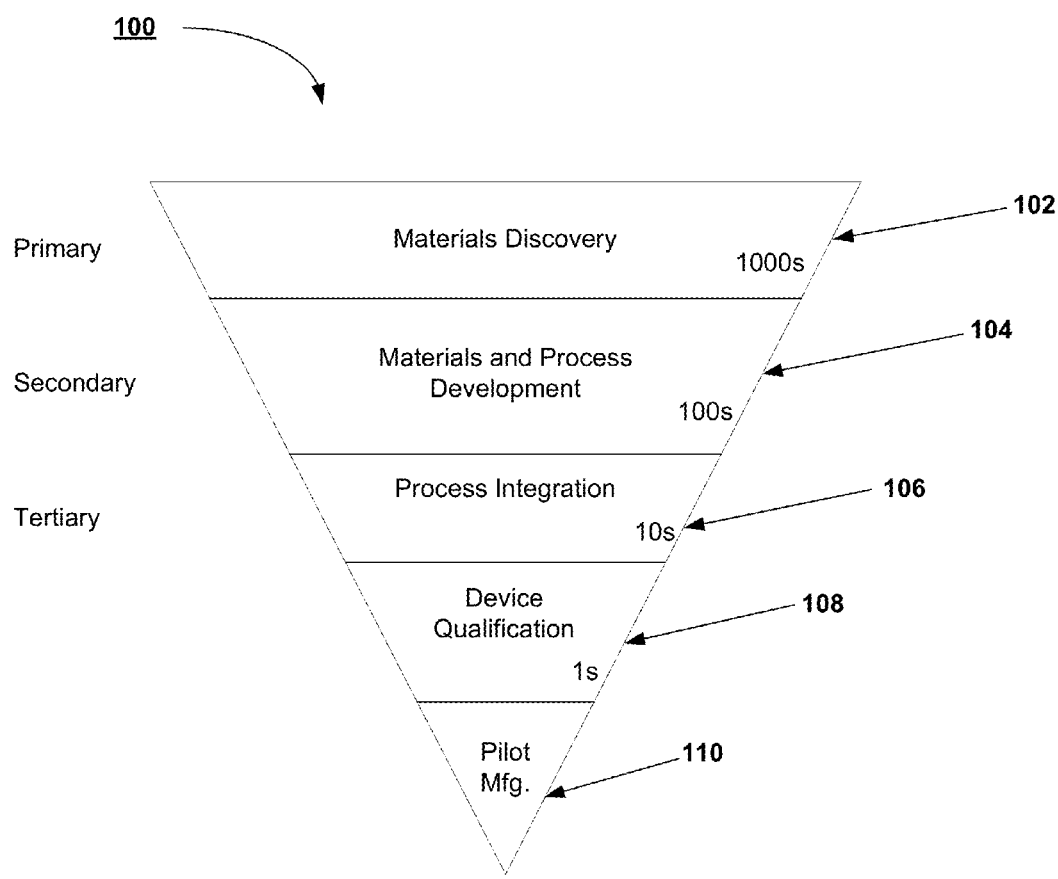
FIG. 1 illustrates a schematic diagram for implementing combinatorial processing and evaluation using primary, secondary, and tertiary screening.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The manufacture of integrated circuits (IC), semiconductor devices, flat panel displays, optoelectronics devices, data storage devices, magneto-electronic devices, magneto-optic devices, packaged devices, and the like entails the integration and sequencing of many unit processing steps. As an example, IC manufacturing typically includes a series of processing steps such as cleaning, surface preparation, deposition, lithography, patterning, etching, planarization, implantation, thermal annealing, and other related unit processing steps. The precise sequencing and integration of the unit processing steps enables the formation of functional devices meeting desired performance metrics such as speed, power consumption, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of semiconductor devices, thin film photovoltaic (TFPV) modules, optoelectronic devices, etc. manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a semiconductor devices, TFPV modules, optoelectronic devices, etc. device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture semiconductor devices, TFPV modules, optoelectronic devices, etc. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the semiconductor devices, TFPV modules, optoelectronic devices, etc. For example, such structures may include, but would not be limited to, contact layers, buffer layers, absorber layers, or any other series of layers or unit processes that create an intermediate structure found on semiconductor devices, TFPV modules, optoelectronic devices, etc. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate (or a series of substrates for reactors with isolated processing regions) that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
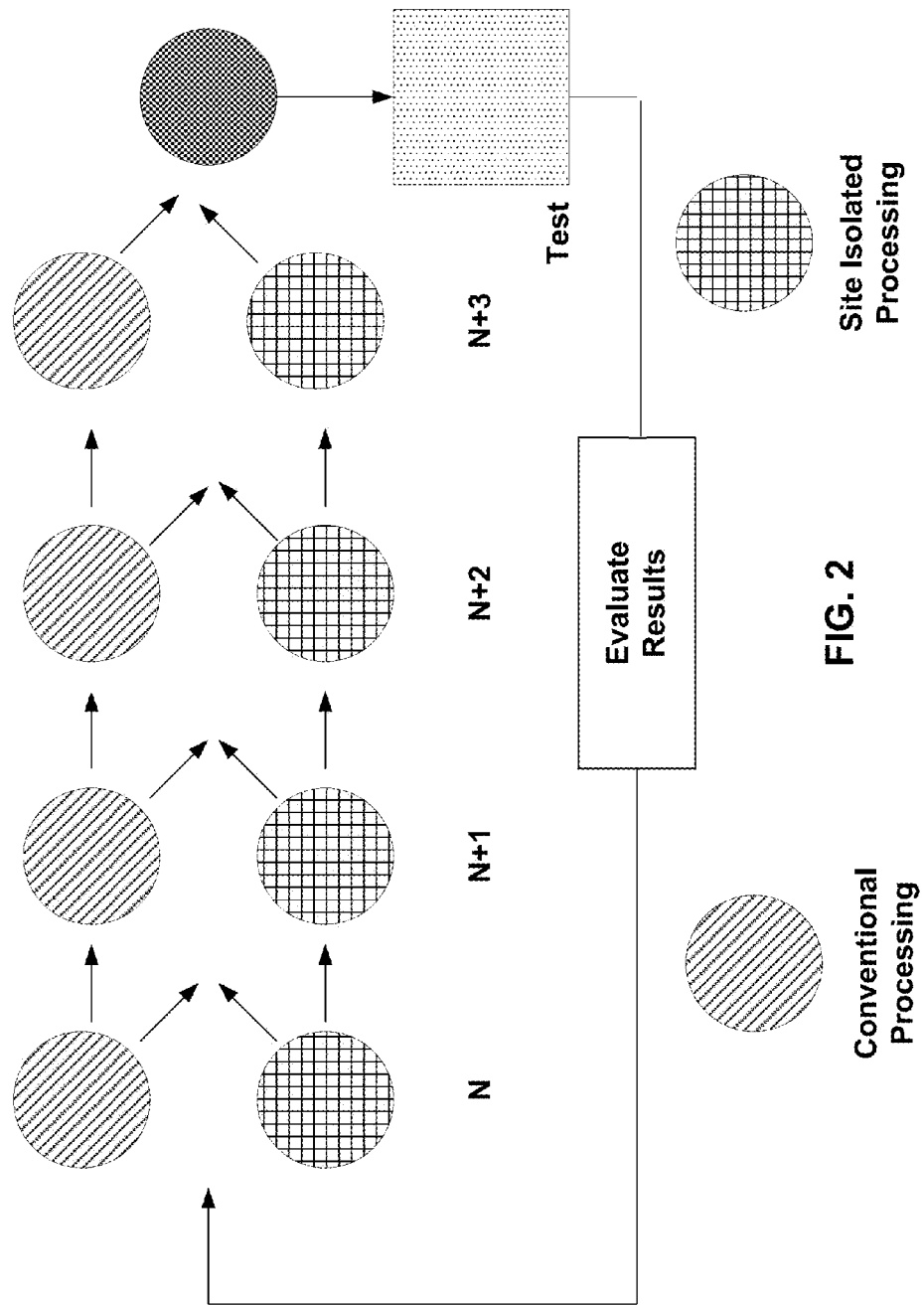
FIG. 2 is a simplified schematic diagram illustrating a general methodology for combinatorial process sequence integration that includes site isolated processing and/or conventional processing in accordance with some embodiments of the present invention.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons. In some embodiments, a set of monolithic substrates are grouped for processing together as a unit through the above flows.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor device, TFPV module, optoelectronic device, etc. manufacturing may be varied.

Methods and systems provided herein enable formation of Group III-V thin films while reducing, if not eliminating, problems associated with current systems and methods. In some embodiments, methods are provided for forming Group III-V thin films at reduced temperatures. Thin films formed according to methods and systems provided herein may be used in various applications, such as, for example, photovoltaic solar cell and light emitting diode (LED) devices and systems.

In some embodiments, systems and methods are provided for forming Group III-V thin films. In some embodiments, time and space co-divided systems and methods are described in which a surfactant precursor and a first precursor are brought in contact with a substrate in a first reaction space and a second precursor is brought in contact with the substrate in a second reaction space that is separate from the first reaction space. In some embodiments, the substrate is brought into contact with the first precursor in a first reaction space, a second precursor in a second reaction space, and a surfactant precursor in a third reaction space. In some embodiments, the substrate is brought into contact with the first precursor in a first reaction space, and a second precursor and a surfactant precursor in a second reaction space. As used herein, a "surfactant" is an atomic or molecular species that increases the surface diffusivity of adatoms during the deposition of a thin film, and wherein the surfactant is not incorporated into the resulting film in concentrations greater than about 1 atomic percent. In some embodiments, the surfactant precursor comprises species such as hydrogen, chlorine, bromine, iodine, arsenic, phosphorous, bismuth, indium, antimony, lead, tin, germanium, selenium, tellurium, magnesium, cadmium, zinc, mercury, etc., or their combinations. In some embodiments, the first precursor is a Group III metal precursor, and exposure of the substrate to the Group III metal precursor forms a Group III metal thin film at sub-monolayer coverage. In some embodiments, the substrate is brought in contact with one or more Group III metal precursors in the same reaction space or different reaction spaces, and exposure of the substrate to the one or more Group III metal precursors is separated by exposure of the substrate to a Group V precursor, or other processing, such as, e.g., spectroscopies to determine thin film quality or composition.

The term "reaction space", as used herein, may refer to any environment suitable for deposition of a material film or thin film on or over a substrate, or the measurement of the physical characteristics of the material film or thin film. In some embodiments, a reaction space may include a chamber. In some embodiments, a reaction space may include a chamber in a system having a plurality chambers. In some embodiments, a reaction space may include a chamber in a system having a plurality of fluidically separated chambers. In some embodiments, a system may include multiple reactions spaces, wherein each reaction space is fluidically separated from another reaction space. In some embodiments, a reaction space may be suitable for conducting measurements on a substrate or a thin film formed on the substrate (or target).

The term "metal nitride", as used herein, may refer to a material comprising one or more metals or one or more semiconductors, and nitrogen. In certain embodiments, a metal nitride (e.g., metal nitride thin film) may have the chemical formula $M_xN_y$, wherein 'M' designates a metal or a semiconductor, 'N' designates nitrogen, and 'x' and 'y' are numbers greater than zero. In some embodiments, 'M' may comprise one or more metals and/or semiconductors. In some embodiments, $M_xN_y$ may refer to a metal nitride, such as a Group III metal nitride (e.g., gallium nitride, indium nitride, aluminum nitride, aluminum gallium nitride, aluminum indium nitride, gallium indium nitride, indium gallium aluminum nitride). In some embodiments, a metal nitride film or thin film may comprise other materials, such as, e.g., chemical dopants. Chemical dopants may include p-type dopants (e.g., magnesium, zinc) and n-type dopants (e.g., silicon, oxygen).

The terms "excited species" and "activated species", as used herein, may refer to radicals, ions and other excited (or activated) species generated via application (or coupling) of energy to a reactant gas or vapor. In some embodiments, energy may be applied via a variety of methods, such as, e.g., ultraviolet radiation, microwave radiation, inductive coupling and capacitive coupling, such as with the aid of a plasma generator. The plasma generator may be a direct plasma generator (i.e., direct plasma generation) or a remote plasma generator (i.e., remote plasma generation). In the absence of coupling energy, plasma generation is terminated. For remote plasma generation, plasma-excited species of a particular vapor phase chemical (e.g., nitrogen-containing plasma species) may be formed in a plasma generator in fluid communication with (or fluidically coupled to) a reaction space having a substrate to be processed. In some embodiments, energy may be applied by exposure of a species of gas to hot (or heated) surfaces or wires, where the interaction of the gas with the heated surfaces or wires generates excited (or activated) species of the gas. Details of methods and systems benefiting from the use of hot wire activation may be found in U.S. patent application Ser. No. 13/302,001 entitled "*Method and Apparatus for Atomic Hydrogen Surface Treatment During GaN Epitaxy*" filed on Nov. 22, 2011 which is herein incorporated by reference.

The term "nitrogen-containing species", as used herein, may include, without limitation, nitrogen radicals, nitrogen ions, and excited (or active) neutral species of nitrogen. In some embodiments, the gaseous source of nitrogen-containing species may include, without limitation, $N_2$, $NH_3$, and/or hydrazine. In some embodiments, the gaseous source of nitrogen-containing species may include mixtures of $N_2$ and $H_2$ gases. In some embodiments, the gaseous source of nitrogen-containing species may include mixtures of $N_2$ and inert gases (any of He, Ne, Ar, Kr, or Xe). In some embodiments, excited nitrogen-containing species may be provided via remote plasma generation or direct plasma generation. In some embodiments, excited nitrogen-containing species may be provided by the thermal disassociation of nitrogen-containing species by exposure to hot surfaces or wires. Coupling energy to a mixture of $N_2$ and $H_2$ gases may generate excited molecular $NH_x$, wherein 'x' is a number greater than or equal to 1.

The term "hydrogen-containing species", as used herein, may include, without limitation, hydrogen radicals, hydrogen ions, and excited (or active) neutral species of hydrogen ($H_2$). In some embodiments, hydrogen-containing species includes $H_2$. In some embodiments, the gaseous source of hydrogen-containing species may include, without limitation, $H_2$, $NH_3$, and/or hydrazine. In some embodiments, the gaseous source of hydrogen-containing species may include mixtures of $H_2$ and $N_2$ gases. In some embodiments, the gaseous source of nitrogen-containing species may include mixtures of $H_2$ and inert gases (any of He, Ne, Ar, Kr, or Xe). In some embodiments, excited hydrogen-containing species may be provided via remote plasma generation or direct plasma generation. In some embodiments, excited hydrogen-containing species may be provided by the thermal disassociation of hydrogen-containing species by exposure to hot surfaces or wires. It will be appreciated that excited hydrogen-containing species may include neutral hydrogen-containing species, such as $H_2$.

The term "adsorption", as used herein, may refer to chemical or physical attachment of atoms or molecules on a surface, such as a substrate surface or a surface of a film or thin film on or over a substrate.

The term "substrate", as used herein, may refer to any workpiece on which film or thin film formation is desired. Substrates may include, without limitation, silicon, silica, sapphire, zinc oxide, SiC, AlN, GaN, Spinel, coated silicon, silicon on oxide, silicon carbide on oxide, glass, gallium nitride, indium nitride or aluminum nitride, or combinations (or alloys) thereof.

The term "monolayer", as used herein, may refer to a single layer of atoms or molecules. In some embodiments, a monolayer includes a monatomic monolayer (ML) having a thickness of one atomic layer. In some embodiments, a monolayer includes the maximum coverage of a particular species on a surface. In such a case, all individual members of the surface adsorbed species may be in direct physical contact with the surface of the underlying substrate, thin film or film. The term "sub-monolayer coverage", as used herein, may refer to a layer of a particular species at a coverage less than one monatomic monolayer. In some embodiments, a layer of a particular species at sub-monolayer coverage may permit additional adsorption of the species or another species. In some embodiments, sub-monolayer coverage may be referred to as "pre-wetting" coverage. For example, a layer of a Group III metal, such as gallium (Ga), indium (In) or aluminum (Al), may include Ga, In or Al atoms collectively having a coverage of about 0.5 ML on a surface, which may be provided with respect to the maximum collective coverage of Ga, In or Al atoms on the surface. In some embodiments, the maximum coverage of a species on a surface is determined by the attractive and repulsive interaction between adsorbed species on the surface. In some embodiments, a layer of a species at a coverage of one monolayer cannot permit additional adsorption of the species in the layer. In some embodiments, a layer of a particular species at a coverage of one monolayer may permit the adsorption of another species in the layer.

The term "exposure", as used herein, may refer to the product of pressure (P) and time (t), (i.e., P×t), wherein 'P' and 't' are provided in units of torr and seconds, respectively. For example, a substrate exposed to a Group III metal precursor at a pressure of $1 \times 10^{-6}$ torr for a period of 60 seconds is contacted with the Group III metal precursor at an exposure (or dosage) of $1 \times 10^{-6}$ torr×60 seconds, or $60 \times 10^{-6}$ torr*s, or 60 Langmuir (L). One Langmuir (L) is defined as $1 \times 10^{-6}$ torr*s.

The term "precursor", as used herein, may refer to a liquid or vapor phase chemical having a species of interest for deposition on a substrate surface. A Group III metal precursor may include a chemical compound that includes one or more Group III metal atoms, such as one or more of Ga, In and Al. A Group V precursor may include a chemical that includes one or more Group V atoms, such as one or more of nitrogen, arsenic and phosphorous. Upon interaction between a substrate surface and a Group III precursor or a Group V precursor, the Group III precursor or the Group V precursor may dissociate to yield a Group III chemical (or adatoms of the Group III atom) or a Group V chemical (or adatoms of the Group V atom) on the substrate surface.

In one aspect of the invention, a method for forming a Group III-V thin film comprises providing a substrate in a first reaction space, contacting the substrate in the first reaction space with a surfactant precursor and a Group III metal precursor (also "Group III precursor" herein) to form a Group III metal thin film, moving the substrate to a second reaction space, and contacting the substrate in a second reaction space with a Group V precursor, thereby forming a Group III-V thin film. In some embodiments, contacting the substrate in the first reaction space with the surfactant precursor and the Group III precursor forms a surfactant layer and a Group III metal thin film, where the Group III metal thin film is at sub-monolayer coverage.

In some embodiments, prior to contacting the substrate with the Group V precursor, the substrate, including the surfactant layer on the substrate and the Group III metal thin film on the substrate, is contacted with a hydrogen-containing species. In some embodiments, the hydrogen-containing species includes $H_2$. In some embodiments, the hydrogen-containing species includes excited species of hydrogen, including one or more of hydrogen cations, hydrogen anions and hydrogen radicals. In some embodiments, excited species of hydrogen may be provided via remote plasma generation or direct plasma generation. In some embodiments, excited species of hydrogen may be provided by the thermal disassociation of molecular hydrogen by exposure of $H_2$ gas to hot surfaces or wires.

In some embodiments, the substrate may be contacted with a hydrogen-containing species in the first reaction space. In such a case, the first reaction space may be evacuated with the aid of purging and/or pumping prior to contacting the substrate with the hydrogen-containing species.

In some embodiments, prior to contacting the substrate in the second reaction space with the Group V precursor, the substrate is moved to a third reaction space and contacted with a hydrogen-containing species in the third reaction space. The third reaction space may be disposed in-between the first and second reaction spaces. In some embodiments, contacting a Group III metal thin film with excited species of hydrogen may reduce multi-layer Group III islands to islands of monatomic height (or thickness).

In some embodiments, following the second reaction space, the substrate is moved to the first reaction space. In other embodiments, following the second reaction space, the substrate is moved to a third reaction space. In some embodiments, in the third reaction space the substrate is contacted with a Group III metal precursor. In some embodiments, in the third reaction space the substrate is contacted with a Group III metal precursor that is different from the Group III metal precursor exposed to the substrate in the first reaction space. In some embodiments, following the third reaction space, the substrate is moved to one or more additional reaction spaces for separate exposure to a Group III metal precursor and a Group V precursor. In some embodiments, in-between exposure to a Group III or Group V precursor, the substrate may be exposed to other species, such as hydrogen-containing species or surfactant precursors, which may aid in maintaining film stoichiometry, in reducing thin film contamination, and in reducing the surface energy for adatom diffusion.

In some embodiments, after forming a Group III-V thin film on the substrate, the substrate, including the Group III-V thin film on the substrate, is contacted with a hydrogen-containing species. In some embodiments, the substrate is contacted with a hydrogen-containing species in the second reaction space. In such a case, the second reaction space may be evacuated with the aid of purging and/or pumping prior to contacting the substrate with a hydrogen-containing species. In some embodiments, the substrate is moved to a third reaction space and contacted with a hydrogen-containing species in the third reaction space. The third reaction space may be disposed in-between the first and second reaction spaces. In some embodiments, the third reaction space is different from the first and second reaction spaces.

Methods of some embodiments of the invention may be used to form Group III-V thin films, such as thin films including nitrogen and one or more of aluminum (Al), gallium (Ga) and indium (In). In some embodiments, methods are provided for forming GaN thin films. In some embodiments, methods are provided for forming AlN thin films. In some embodiments, methods are provided for forming InN thin films. In some embodiments, methods are provided for forming AlGaN thin films. In some embodiments, methods are provided for forming AlInN thin films. In some embodiments, methods are provided for forming GaInN thin films. In some embodiments, methods are provided for forming InGaAlN thin films.

In some embodiments, in the first reaction space the substrate is contacted with a surfactant precursor and a single Group III metal precursor. In some embodiments, in the first reaction space the substrate is contacted with a surfactant precursor and multiple Group III metal precursors, such as one or more of Al, Ga and In-containing precursors. In some embodiments, the substrate is contacted with a surfactant precursor and different Group III metal precursors in separate reaction spaces. In some embodiments, the substrate is contacted with a Group V precursor between exposures to Group III metal precursors. In some embodiments, the substrate is contacted with a surfactant precursor between exposures to Group III metal precursors and Group V precursors.

In some embodiments, the first reaction space is different from the second reaction space. In some embodiments, the first reaction space is fluidically separated from the second reaction space. In some embodiments, the first reaction space and the second reaction space are separate pressure-regulated environments. In some embodiments, gases from the first reaction space are prevented from entering the second reaction space, and gases from the second reaction space are prevented from entering the first reaction space.

Figure 3:
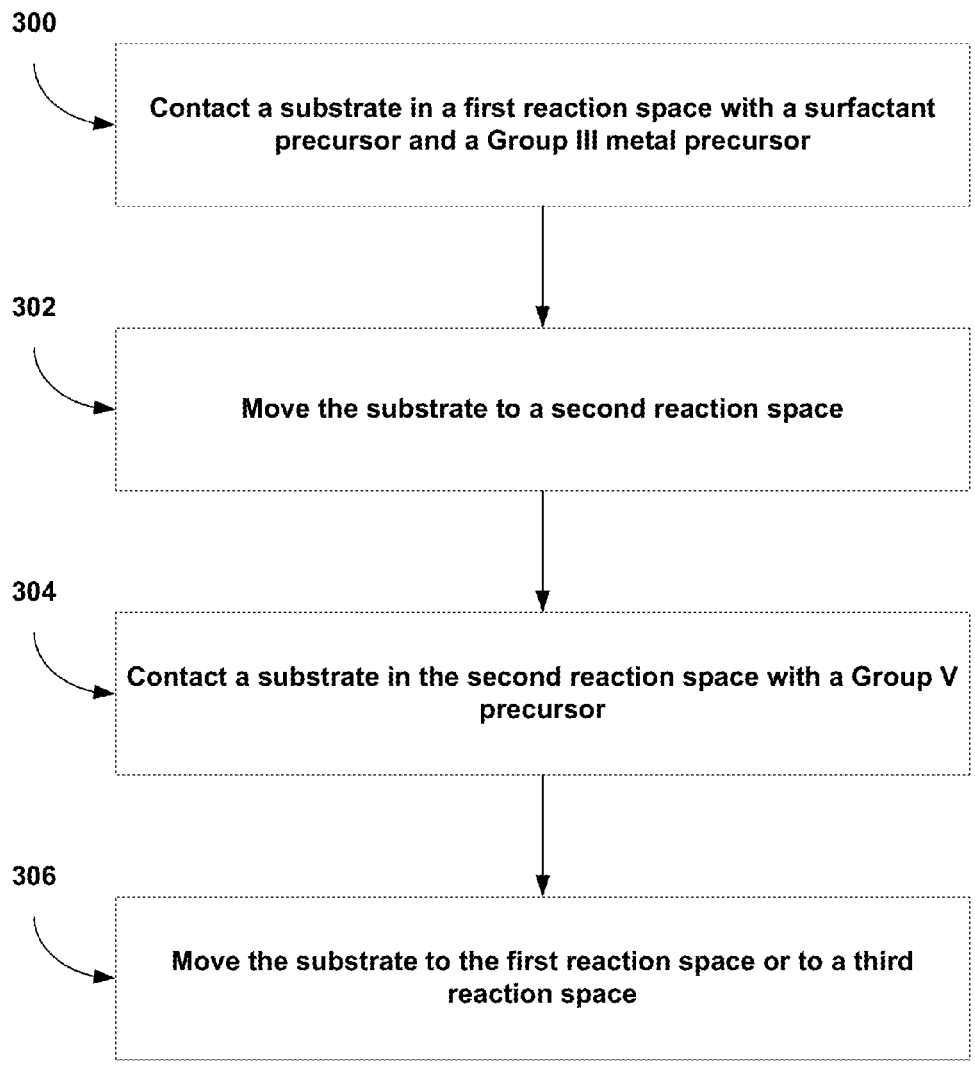
FIG. 3 presents a flow chart for the deposition of a film according to some embodiments.

With reference to FIG. 3, a method for forming a Group III-V thin film is illustrated, in accordance with an embodiment of the invention. In a first step 100, with the substrate disposed in a first reaction space, the substrate is contacted with a surfactant precursor and a Group III metal precursor (e.g., trimethyl gallium) to form a surfactant layer and a Group III metal thin film on the substrate. The substrate may be disposed in the first reaction space by moving the substrate (e.g., moving or rotating a susceptor having the substrate) to the first reaction space or moving the first reaction space (e.g., rotating the first reaction space) to the substrate. In some embodiments, the substrate is contacted for a time period no more than that required to form a surfactant layer of between about 0 and about 5 monolayers (ML) and a Group III metal thin film at sub-monolayer coverage. Advantageously, the thickness of the surfactant layer is maintained at about 2 ML. In some embodiments, contacting the substrate in the first reaction space with the surfactant precursor and the Group III metal precursor forms a layer of a Group III metal having a thickness less than about 1 ML. In some embodiments, contacting the substrate in the first reaction space with the surfactant precursor and the Group III metal precursor forms a layer of a Group III metal having a thickness up to about 1 ML. In some embodiments, contacting the substrate in the first reaction space with the surfactant precursor and the Group III metal precursor forms a layer of a Group III metal having a thickness greater than about 1 ML. In some embodiments, contacting the substrate in the first reaction space with the surfactant precursor and the Group III metal precursor forms a layer of a Group III metal at sub-monolayer coverage.

In some embodiments, an exposure of the Group III metal precursor may be selected to provide a Group III metal thin film at a predetermined coverage. Coverage may be assessed by a variety of spectroscopy tools (see below), such as x-ray photoelectron spectroscopy (XPS). In achieving a predetermined coverage of a Group III metal thin film, it will be understood that a trial-and-error approach may be used to find an exposure of the Group III metal precursor corresponding to the predetermined coverage. For example, in one system it may be determined that achieving a Group III metal thin film coverage at 0.3 ML coverage requires exposure of a substrate (also "target" herein) to a Group III metal precursor at about 1 L.

Next, in step 302, the substrate is disposed in a second reaction space. In some embodiments, the substrate may be moved (i.e. rotated) to the second reaction space. In other embodiments, the second reaction space may be moved (e.g., rotated) to the substrate. In some embodiments, movement of the substrate to the second reaction space comprises rotating a susceptor from the first reaction space to the second reaction space.

Next, in step 304, with the substrate in the second reaction space, the substrate, including the Group III metal thin film on the substrate, is contacted with a Group V precursor to form a Group III-V-containing thin film. In some embodiments, the Group III-V-containing thin film includes Group III-V species. In some embodiments, prior to contacting the substrate with the Group V precursor, the substrate may be contacted with hydrogen-containing species (e.g., $H_2$, excited species of hydrogen). The substrate may be contacted with hydrogen-containing species in the first reaction space, the second reaction space, or a third reaction space. In some embodiments, prior to contacting the substrate with hydrogen-containing species, a reaction space having the substrate may be evacuated with the aid of purging and/or pumping.

In some embodiments, the substrate is exposed to a hydrogen-containing species. In some embodiments, the hydrogen-containing species includes plasma-excited species of hydrogen. In some embodiments, the hydrogen-containing species includes active neutral species of hydrogen.

In some embodiments, the Group V precursor includes a nitrogen-containing species. In some embodiments, the Group V precursor includes plasma-excited species of nitrogen. In some embodiments, the Group V precursor includes active neutral species of nitrogen. In some embodiments, the Group V precursor includes active neutral species of nitrogen comprises nitrogen species having the lowest excited state of molecular nitrogen ($A^3\Sigma_u^+$). In some embodiments, the substrate is contacted for a time period no more than that required to form a Group III-V thin film at sub-monolayer coverage. In some embodiments, contacting the substrate in the second reaction space with the Group V precursor forms a Group III-V thin film having a thickness less than about 1 ML. In some embodiments, contacting the substrate in the second reaction space with the Group V precursor forms a Group III-V thin film having a thickness up to about 1 ML. In some embodiments, contacting the substrate in the first reaction space with the Group V metal precursor forms a layer of a III-V thin film having a thickness greater than about 1 ML. In some embodiments, contacting the substrate in the second reaction space with the Group V precursor forms a Group III-V thin film at sub-monolayer coverage.

In some embodiments, plasma-excited species of nitrogen may include a nitrogen and hydrogen-containing species formed by providing energy to a mixture of $N_2$ and $H_2$ gases, $NH_3$, a mixture of $N_2$ and $NH_3$, hydrazine ($N_2H_4$), and/or a mixture of $N_2$ and $N_2H_4$. In some embodiments, plasma-excited species of nitrogen include $NH_x$, wherein 'x' is a number greater than or equal to 1. For example, plasma-excited species of nitrogen may include one or more of NH, $NH_2$ and $NH_3$, and ions and radicals of such species, such as, for example, $NH^+$, $NH_2^+$, $NH_3^+$. In some embodiments, plasma-excited species of nitrogen are formed by inductively coupling energy to a mixture of $N_2$ and $H_2$ gases having a ratio of $N_2$ and $H_2$ flow rates of about 0.5:1, or 1:1, or 2:1, or 3:1, or 4:1, or 5:1. In some embodiments, plasma-excited species of nitrogen are formed by inductively coupling energy to a mixture of $N_2$ and $H_2$ gases having an $H_2$ flow rate that is about ⅓ (or 0.333) of the total $N_2$ and $H_2$ flow rate.

In some embodiments, the substrate may be contacted with Group III and Group V precursors until a Group III-V-containing thin film of predetermined thickness is formed on the substrate.

With continued reference to FIG. 3, in step 306, the substrate is moved to the first reaction space or a third reaction space. In some embodiments, the substrate is moved to the first reaction space and contacted with a surfactant precursor and a Group III metal precursor. In some embodiments, the substrate is moved to a third reaction space that is different from the first and second reaction spaces. In the third reaction space, the substrate may be contacted with surfactant precursor, a Group III metal precursor, a Group V precursor, or another species. For example, the substrate may be contacted with vapor phase chemical to aid in removing contaminants (e.g., carbon) from a Group III-V thin film formed on the substrate.

In some embodiments, the substrate is moved to successive reaction spaces (see below) until a thin film of predetermined thickness and composition is formed.

In some embodiments, the substrate may be moved to the first reaction space to repeat steps 300 to 306, as described above.

In some embodiments, after the second reaction space, the substrate may be moved to one or more environments that include one or more thin film diagnostic tools, such as one or more thin film spectroscopy tools, to aid in assessing the physical characteristics (e.g., conductivity, thickness, long-range periodicity, composition) and/or quality of a thin film formed on the substrate. Spectroscopy tools may include reflection-absorption infrared spectroscopy (RAIRS), low-energy electron diffraction (LEED) spectroscopy, x-ray photoelectron spectroscopy (XPS), Auger electron spectroscopy (AES), scanning probe microscopy (STM, AFM), near edge x-ray absorption fine structure (NEXAFS), spectral reflectance and transmission, single wavelength reflectance and transmission, optical pyrometry (single wavelength, dual wavelength, or using spectral radiometry), emmisometry, ellipsometry, surface light scattering, and optical polarimetry.

In another aspect of the invention, an apparatus for depositing a Group III-V thin film on a substrate is provided. The apparatus comprises a first reaction space and a second reaction space, the first reaction space fluidically separated from the second reaction space. The apparatus further includes a susceptor or substrate holder for bringing a substrate in contact with each of the first and second reaction spaces. In some embodiments, the apparatus includes a controller (see, e.g., FIG. 4) for directing a surfactant precursor and a Group III precursor into the first reaction space at a first exposure and a Group V precursor into the second reaction space at a second exposure. In some embodiments, the first exposure is for providing a surfactant layer and layer of a Group III metal. In some embodiments the Group III metal is at sub-monolayer (or pre-wetting) coverage. Is some embodiments, the thickness of the surfactant layer is more than one monolayer and less than two monolayers.

Figure 4:
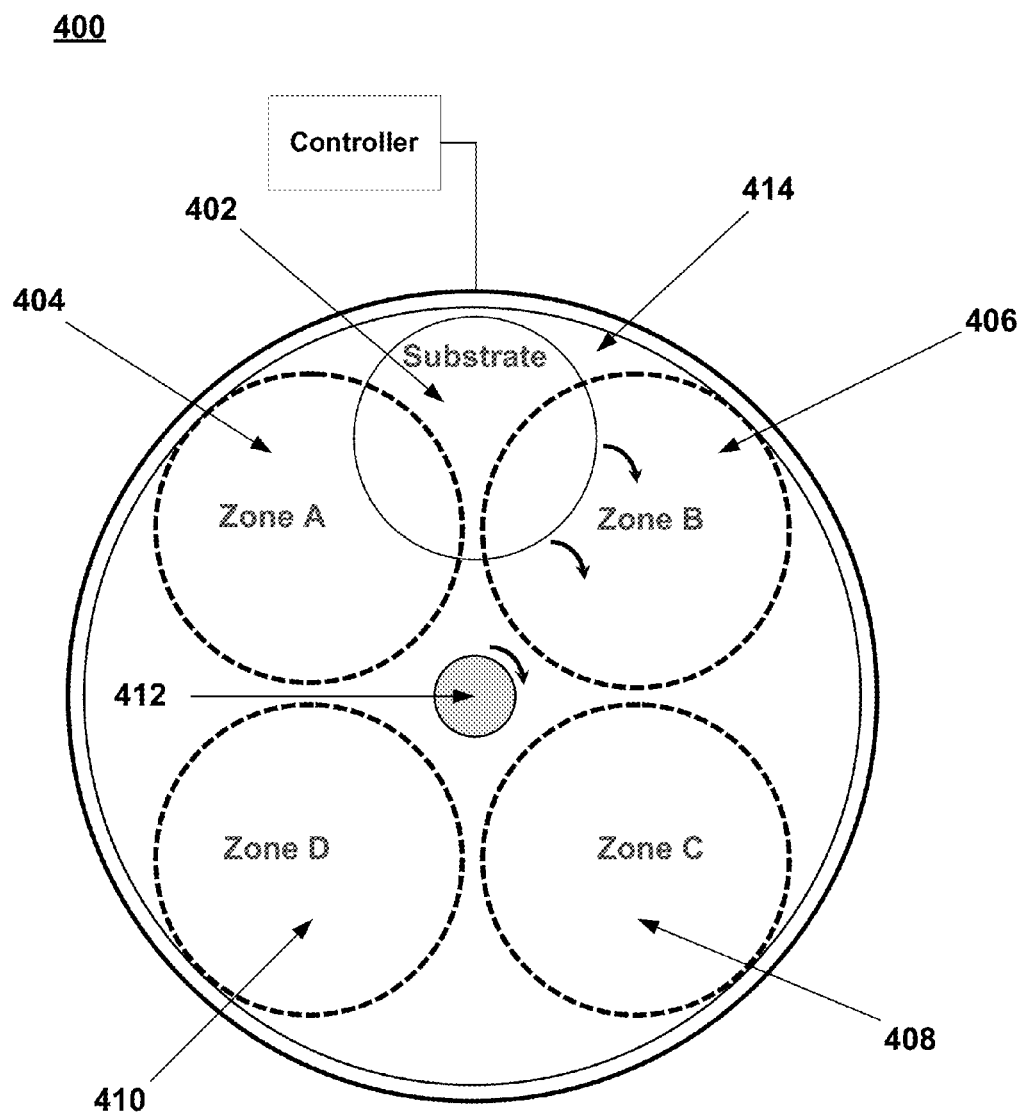
FIG. 4 illustrates a schematic diagram illustrating four processing regions and a substrate according to some embodiments.

In some embodiments, a number of the practical problems with the state of the art for the deposition of binary semiconducting thin films may be mitigated by separating the environment (or reaction space) in which the Group III metal atoms are deposited onto a substrate from the environment in which these adsorbed metal atoms are exposed to a Group V-containing precursor gas to form the Group III-V thin film or compound. In some embodiments, the substrate is moved between deposition reaction spaces (or environments) cyclically to deposit a film of a predetermined thickness. FIG. 4 is an example of a system of linked sequential processing environments, which may be constructed for this purpose.

FIG. 4 illustrates a schematic diagram illustrating a processing apparatus, 400, comprising four processing regions and illustrating a substrate according to some embodiments. A similar apparatus has been described in U.S. application Ser. No. 13/025,046 filed on Feb. 10, 2011, entitled "METHODS AND SYSTEMS FOR FORMING THIN FILMS" and is incorporated herein by reference. A deposition chamber (not shown) comprises a reaction zone wherein there are four independent processing regions. The independent processing regions are fluidically isolated from one another. Although four independent processing regions are illustrated, those skilled in the art will appreciate that any number of independent processing regions can be envisioned, limited only by the number of desired processing steps in the sequence and practical physical limitations. For example, Zone-D can be omitted, and the process sequence comprises Zone-A, Zone-B and Zone-C. Alternatively, both Zone-C and Zone-D are omitted, and the process sequence comprises Zone-A and Zone-B. Further, the processing order, e.g., Zone-A to Zone-B to Zone-C to Zone-D, are shown for illustrative purposes, and those skilled in the art will appreciate that the zones can be arranged in any order. For example, Zone-C can be positioned before Zone-B to form a process sequence comprises Zone-A, Zone-C, Zone-B, and Zone-D. Although a circular configuration is illustrated, those skilled in the art will appreciate that any suitable and practical configuration may be used. Examples might include linear configurations, parallel configurations, oval configurations, square or rectangular configurations, etc.

In FIG. 4, substrate, 402, is held on a substrate holder, 414. Although one substrate is illustrated in FIG. 4, those skilled in the art will appreciate that substrate holder, 414, will generally accommodate multiple substrates resulting in improved processing efficiency. The use of processing apparatus, 400, will be described by using the deposition of an InGaAlN film as an example. Those skilled in the art will appreciate that the features of processing apparatus, 400, can be applied to many different types of processing sequences, including, but not limited to, the growth of the variety of III-V materials listed above, etc.

In Zone-A, 404, the substrate is exposed to the deposition precursor gases. For this example, the gases might comprise surfactants such as hydrogen, chlorine, bromine, iodine, arsenic, phosphorous, bismuth, indium, antimony, lead, tin, germanium, selenium, tellurium, magnesium, cadmium, zinc, mercury, etc., or combinations thereof and Group III metal organic precursors of aluminum, gallium, indium, or combinations thereof. Zone-A generally does not include the use of plasma energy. The absence of plasma energy in Zone-A reduces the frequency of undesirable gas phase reactions that lead to the formation of particulate matter that is deposited on the substrate rather than forming the desired film through well controlled surface reactions. The precursor gases will adsorb onto the surface, diffuse across the surface, and interact with reactive surface sites. In the example illustrated in FIG. 4, processing apparatus, 400, has a generally circular shape and substrate holder, 414, and substrate, 402, can be rotated about a central axis, 412, to repeatedly expose the substrate to the sequence of processing regions. The exposure dosage of the gases or reactive species to the substrate in the various processing zones can be influenced through combinations of the gas concentration, gas flow rate, pressure, and rotation speed. In this manner, effective growth rates from less than 1 monolayer per cycle to several monolayers per cycle can be achieved.

In Zone-B, 406, the substrate may be exposed to excited species of hydrogen, such as those generated from a hydrogen plasma. The exposure to excited species of hydrogen can be used to control the amount of hydrogen on the surface and therefore influence the incorporation and diffusion of Ga across the surface as discussed previously. The exposure to excited species of hydrogen in this zone will minimize the tendency for Ga to aggregate at higher Ga concentrations by assisting the incorporation of the Ga into the film growth front.

In Zone-C, 408, the substrate may be exposed to excited species of nitrogen, such as those generated from a nitrogen plasma. The advantageous aspects of the nitrogen plasma are previously described. The reaction of the Group III thin film on the substrate with the excited species of nitrogen forms a Group III-N thin film, where the thickness of the Group III-N thin film deposited may be less than one monolayer per cycle to several monolayers per cycle.

In Zone-D, 410, in-situ metrology techniques may be employed to monitor and control the growth of the GaN as the substrate is repeatedly cycled through the processing regions Zone-A, Zone-B, Zone-C, etc. Examples of suitable metrology techniques comprise reflectometers and ellipsometers for measuring thickness, Fourier Transform Infra-Red (FTIR) spectrometers for measuring Ga and In surface concentrations, optical methods for measuring surface roughness, pyrometers for measuring substrate temperature, etc. Data collected and analyzed from the metrology systems may be used to control the progress of the film growth.

In some embodiments, the substrate is exposed to excitations of an inert gas, such as those generated from an inert gas plasma. Alternately, laser irradiation may be used to excite the inert gas. In some embodiments, the exposure of the substrate to excitations of an inert gas may be done in Zone B. Examples of suitable inert gases comprise one or more of He, Ne, Ar, Kr, Xe, or combinations thereof. The plasma will generate excited neutral species with internal energies above about 4 eV. This energy may be used to facilitate the decomposition of the Group III metal organic species and the desorption of the by-products. The plasma conditions are chosen such that the ion density at the substrate surface is negligible and ion bombardment of the surface is minimized to prevent damage.

In some embodiments, this technique may mitigate the gas phase reaction between Group III and Group V-containing precursor gases, because the Group III and Group V precursor gases will not be present in significant amounts in the same reaction volume due to flow and pressure control of each individual reaction space. Maintaining separate environments further allows for optimization of the environment for the delivery of Group III adatoms to the surface, and a separate environment (or reaction space) where the delivery of the Group V precursor is optimized for surface reaction to form the desired III-V compound. In the case of InGaAlN thin films, the Group III metal delivery may be optimized for use of metal organic precursors such as (here described for the case of gallium; similarly for other Group III metals) trimethylgallium, triethylgallium, diethylgallium chloride, and coordinated gallium hydride compounds, (e.g., dimethylgallium hydride), etc.; thermal evaporation of the Group III material; or gaseous Group III chlorides or Group III halides, among other methods. In some embodiments, in the case of InGaAlN thin films, the nitridation environment may be optimized for various methods to deliver active nitrogen to the substrate surface, including plasma excitation or thermal disassociation of nitrogen-containing species.

The separate deposition environments for Group III and Group V elements may enable the isolation of incompatible processes in each of the independent environments. For example, different gas flows and pumping speeds may be used in the Group III and Group V environments. Additionally, mechanisms useful for the creation of reactive Group V species but detrimental to the delivery of Group III precursors, for example ionization and disassociation via plasma excitation, may be used without constraints due to the absence of Group III precursors in the Group V reaction environment Methods of some embodiments of the invention may enable the use of lower substrate temperatures than is typical in the state of the art MOCVD due to the improved crystalline quality resulting from the increased surface migration of metal adatoms. For example, Sugihara et al. (Phys. Stat. Sol. (a) 176, 323 (1999), which is entirely incorporated herein by reference) report 750° C. for their GaN growths, compared to approximately 1050° C. for typical MOCVD. Reduced processing temperatures relative to the state of the art enable the use of less costly substrates and a simplified reactor design.

Separation of the Group III and Group V deposition environments necessarily creates a situation where the surface of the substrate will have an excess of Group III atoms for a portion of the deposition cycle. Group III metals, in particular Ga and In, may form droplets on the substrate surface when the Group III element is in excess of the stoichiometric amount of the Group V element needed to form the desired III-V compound. For example see D. Sugihara et al., and "Epitaxial Growth of GaN on Sapphire (0001) Substrates by Electron Cyclotron Resonance Molecular Beam Epitaxy," S. H. Cho et al., Jpn. J. Appl. Phys. 34, L236 (1995), which are entirely incorporated herein by reference. Group III metal droplets which do not dissolve during processing and remain in the film may damage the optoelectronic material properties and may be incompatible with device manufacture.

Methods of some embodiments of the invention may enable Group III metal droplet formation to be mitigated, if not eliminated, by depositing a sub-monolayer coverage of the Group III metal during each cycle. At this coverage, the Group III metal thickness may be less than the wetting layer thickness, and metal droplet formation may be suppressed. Additionally, sub-monolayer coverage of metal adatoms reduces the number of interactions between the adatoms, reducing their self-scattering and increasing the adatom surface mobility.

In some embodiments, hydrogen-containing species may be used during the formation of the Group III-V thin film on a substrate. The hydrogen-containing species may be maintained in a separate environment from the Group III and Group V reaction environments, and may be employed after Group III environment, after Group V environment, or both. In some embodiments, hydrogen-containing species may be brought in contact with a substrate, a Group III metal film, or a Group III-V film on the substrate in a reaction space that is separate from a reaction space having a Group III or Group V precursor. In an embodiment, an environment comprising hydrogen-containing species may be employed sequentially after a Group V reaction space, where excess Group III atoms or droplets will be converted to Group III halides, e.g., $GaH_3$. Group III halides may be volatile, and droplets will be removed from the surface each cycle. This allows the growth surface to be stoichiometric at the beginning of each deposition cycle. In some embodiments, an environment comprising hydrogen-containing species may be employed sequentially after a Group III reaction space, where the excited species of hydrogen may reduce multi-layer Group III islands to islands of monatomic height (or thickness).

In some embodiments, an additional benefit of exposing the film to hydrogen-containing species is that activated species of hydrogen may scavenge (or getter) carbon atoms and/or hydrocarbon groups, which are due to residual contamination from the alkyl groups present in metal organic precursors. See, for example, Bornscheuer et al., "Production of Atomic Hydrogen and its Use for the Growth of GaN with Low Carbon Level," Phys. Stat. Sol. (a) 159, 133 (1997), and Kim et al., "Effect of Hydrogen on GaN Growth by Remote Plasma-Enhanced Metal-Organic Chemical Vapor Deposition," Phys. Stat. Sol. (a) 176, 337 (1999), which are entirely incorporated herein by reference. In some embodiments, excited hydrogen-containing species, created by plasma excitation or by thermal disassociation, may be used to scavenge and remove one or more impurity species selected from carbon, sulfur and oxygen. This may advantageously minimize, if not eliminate, further contamination of the substrate or thin film over the substrate.

In some embodiments, an additional environment may be maintained where thin film properties may be measured in-situ. In this environment no deposition occurs and the optical viewports, lens systems, spectroscopies, and other ports needed to make stable and accurate measurements may be maintained. Measurements which could be performed in this environment include, but are not limited to, reflection-absorption infrared spectroscopy (RAIRS), low-energy electron diffraction (LEED) spectroscopy, x-ray photoelectron spectroscopy (XPS), Auger electron spectroscopy (AES), scanning probe microscopy (STM, AFM), near edge x-ray absorption fine structure (NEXAFS), spectral reflectance and transmission, single wavelength reflectance and transmission, optical pyrometry (single wavelength, dual wavelength, or using spectral radiometry), emmisometry, ellipsometry, surface light scattering, and optical polarimetry. Thin film data gathered from measurements, such as those made with the aid of tools (e.g., spectrometers) provided herein, may include thickness, dielectric constant, conductivity (or resistivity), optical attenuation constant, temperature, and emissivity. Such data may be used in a real-time closed loop control system, where aspects of the deposition environments may be actuated to maintain the measured parameters within a specified tolerance. This arrangement may provide for thin film property optimization, device performance optimization, thin film deposition parameter optimization (e.g., optimization of reaction space pressures, deposition temperatures, flow rates), run-to-run repeatability, system-to-system repeatability and matching, and improved yield of manufactured goods.

In some embodiments of the invention, controllers and systems are provided for controlling and regulating Group III-V thin film formation. In some embodiments, a control system is provided to control various process parameters, such as, for example, substrate and/or substrate holder (or susceptor) temperature, reactor pressure, reaction space pressure, reaction chamber pressure, plasma generator pressure, the flow rate of gas (e.g., $N_2$) into a plasma generator, the flow rate of gas (e.g., metalorganic species) into a reaction space, the rate at which the substrate is moved from one reaction space to another, the rate at which the substrate rotates during thin film formation, power to a plasma generator (e.g., direct current or radio frequency power), and a vacuum system in fluid communication with the reaction chamber. The vacuum system may comprise various pumps configured to provide vacuum to the reaction chamber, such as, e.g., one or more of a turbomolecular ("turbo") pump, a cryopump, an ion pump and a diffusion pump, in addition to a backing pump, such as a mechanical pump.

In some embodiments of the present invention, surfactant species are deposited on the surface of the substrate either before, after, or concurrently with the deposition of the Group III metal precursor. An important physical process in the deposition of MOCVD films is the diffusion of the metal atoms across the surface to a reactive site such as an edge of a step or island. The energy barrier for this diffusion can be significant. One method to overcome this barrier is to increase the temperature of the substrate. This is one reason why typical MOCVD processes require deposition temperatures of about 1000° C. and higher. Another method to overcome this barrier involves the use of surfactant species to lower the surface energy for diffusion of the metal atom. The surfactant species will cover the substrate surface and facilitate the diffusion of the arriving metal atoms across the growth front and the incorporation of arriving metal atoms into the growth front at a highly-coordinated surface site. Typically, the surfactant species is chosen to be an atom that segregates easily to the surface of the growing film. This ensures that the surfactant species is not incorporated into the film. Examples of surfactant species for the growth of III-V films comprise hydrogen, chlorine, bromine, iodine, arsenic, phosphorous, bismuth, indium, antimony, lead, tin, germanium, selenium, tellurium, magnesium, cadmium, zinc, mercury, etc., or their combinations.

Figure 5:
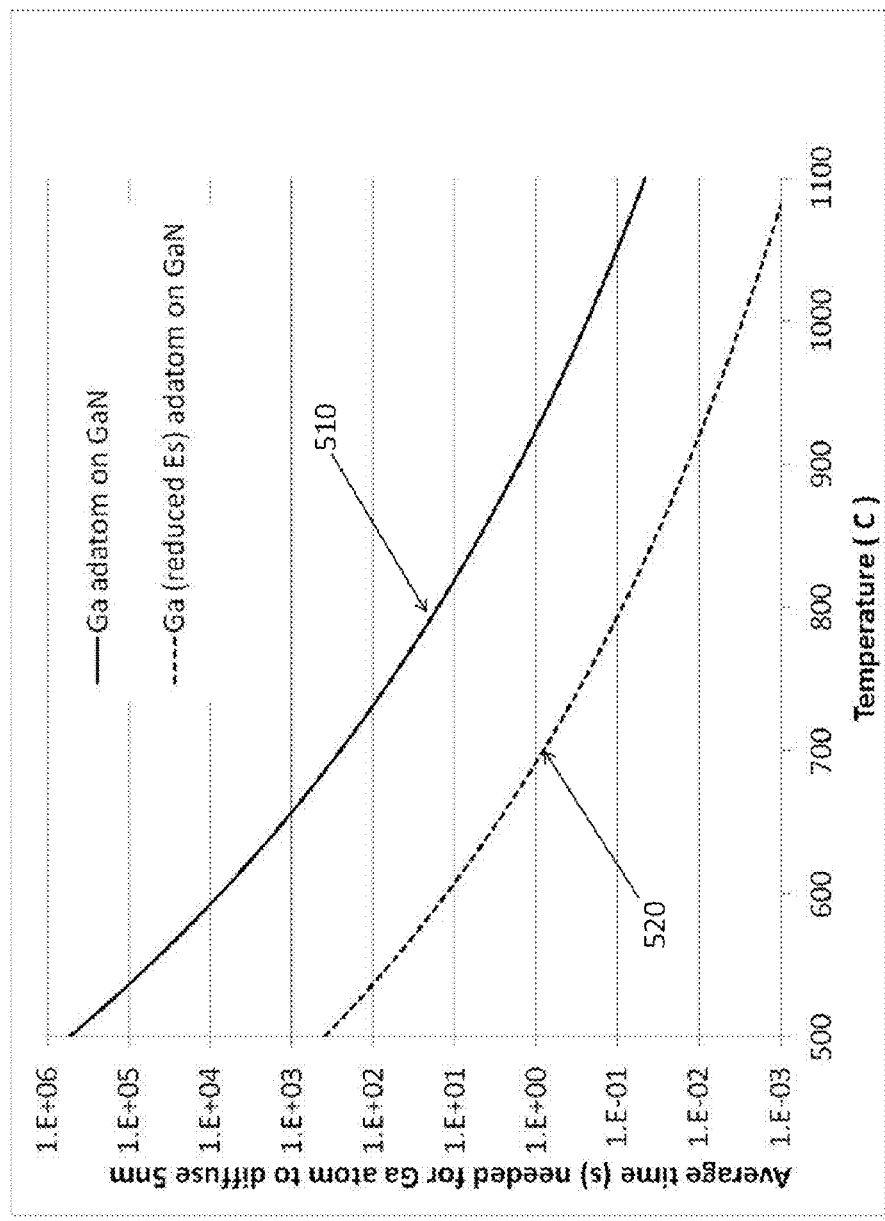
FIG. 5 presents a graph of the calculated average time needed for a Ga atom to diffuse 5 nm as a function of temperature illustrating the benefits of using a surfactant.

FIG. 5 presents a graph of the calculated average time in seconds needed for a Ga atom to diffuse 5 nm as a function of temperature illustrating the benefits of using a surfactant. The calculation assumed that the surfactant decreased the surface energy by about 20%. Note that this decrease in the surface energy of about 20% is equal to increasing the temperature by about 300° C. The graph was calculated from the expression contained in Eqn. 1.

$$\tau = \frac{\lambda_s^2}{D_{s,0} e^{-E_{A,s}/k_B T}} \quad \text{Eqn. 1}$$

Eqn. 1 is adapted from Koleske et al. (Journal of Applied Physics, vol. 84, no. 4, pages 1998-2008, Aug. 15, 1998), which is herein incorporated by reference, where $\tau$ is the time constant to diffuse a distance $\lambda_S$ for Ga atoms on a GaN surface, $D_{s,0}$ is the diffusion coefficient, $E_{A,s}$ is energy barrier to diffusion, $k_B$ is Boltzman's constant, and T is the substrate temperature in degrees Kelvin. In FIG. 5, $\lambda_S$ is taken to be 5 nm; similar figures can be produced at various values of $\lambda_S$. In FIG. 5, the value of $D_{s,0}$ is taken to be 0.007 cm$^2$s$^{-1}$ and the value of $E_{A,s}$ is taken to be 2.48 electron volts (eV) for the upper curve 510, where the values are taken from Koleske et al. and curve 510 is representative of the diffusion on a Ga adatom on GaN with no surfactant. In the lower curve 520, $E_{A,s}$ is taken to be 2.0 eV in the lower curve to demonstrate the surfactant effect. As mentioned with respect to FIG. 5, a decrease in the surface energy will allow a Ga adatom to diffuse the same distance in the same amount of time, but at a lower temperature. MOCVD films grown at lower temperatures (i.e. about 720° C.) have increased surface roughness when compared to MOCVD films grown at higher temperatures (i.e. about 1050° C.). This is largely due to the exponential decrease in the adatom rate of diffusion on the surface at the lower temperatures. To highlight the benefits of using a surfactant species, an MOCVD GaN film of 1 µm was grown on sapphire at 720° C. without a surfactant species. Atomic force microscopy (AFM) was used to measure the surface roughness over a 20 nm by 20 nm area. The root mean square (rms) roughness was determined to be about 32.3 nm. A smaller area of 1 nm by 1 nm was measured and the rms roughness was determined to be about 2.7 nm. A second MOCVD GaN film of 1 µm was grown on sapphire at 720° C. using a surfactant species comprising about 2 ML of In. AFM was used to measure the surface roughness over a 20 nm by 20 nm area. The rms roughness was determined to be about 9.4 nm. A smaller area of 1 nm by 1 nm was measured and the rms roughness was determined to be about 1.0 nm. The surface roughness of the sample prepared using the surfactant had a surface roughness that was about 3 times smaller than the sample prepared without the surfactant species. This highlights the benefits of using the surfactant.

Figure 6:
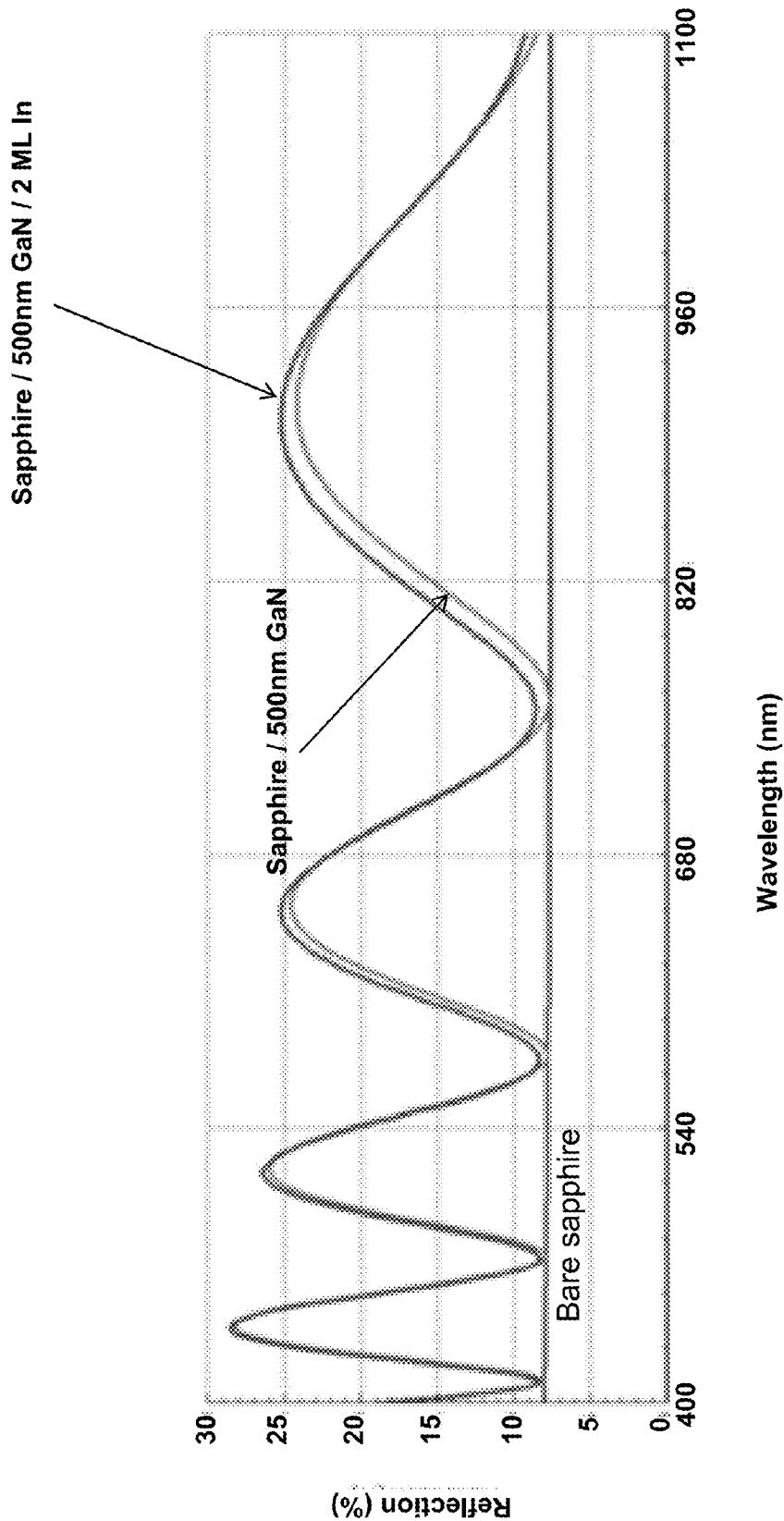

FIG. 6 presents a graph of the calculated reflectivity as a function of wavelength from about 400 nm to about 1100 nm for three cases: a bare sapphire substrate, a GaN layer, and a GaN layer with 2 ML of In. The reflectivity of the bare sapphire substrate is, in comparison to the other two cases, constant over this wavelength region. The reflectivity of the sample with 500 nm GaN grown on the sapphire substrate exhibits oscillations due to interference from the front and rear surfaces of the film. The reflectivity of the sample with 500 nm GaN grown on the sapphire substrate and including 2 ML of In on the surface also exhibits oscillations due to interference from the front and rear surfaces of the film. However, the calculation including the 2 ML of In also exhibits increased reflectivity, especially at longer wavelengths. Although small, this difference in reflectivity is significant and can be used as an in-situ monitor during the process to measure the surface coverage of the surfactant (i.e. In) and to ensure that the desired amount of about 2 ML of the surfactant is maintained on the surface.

Figure 7:
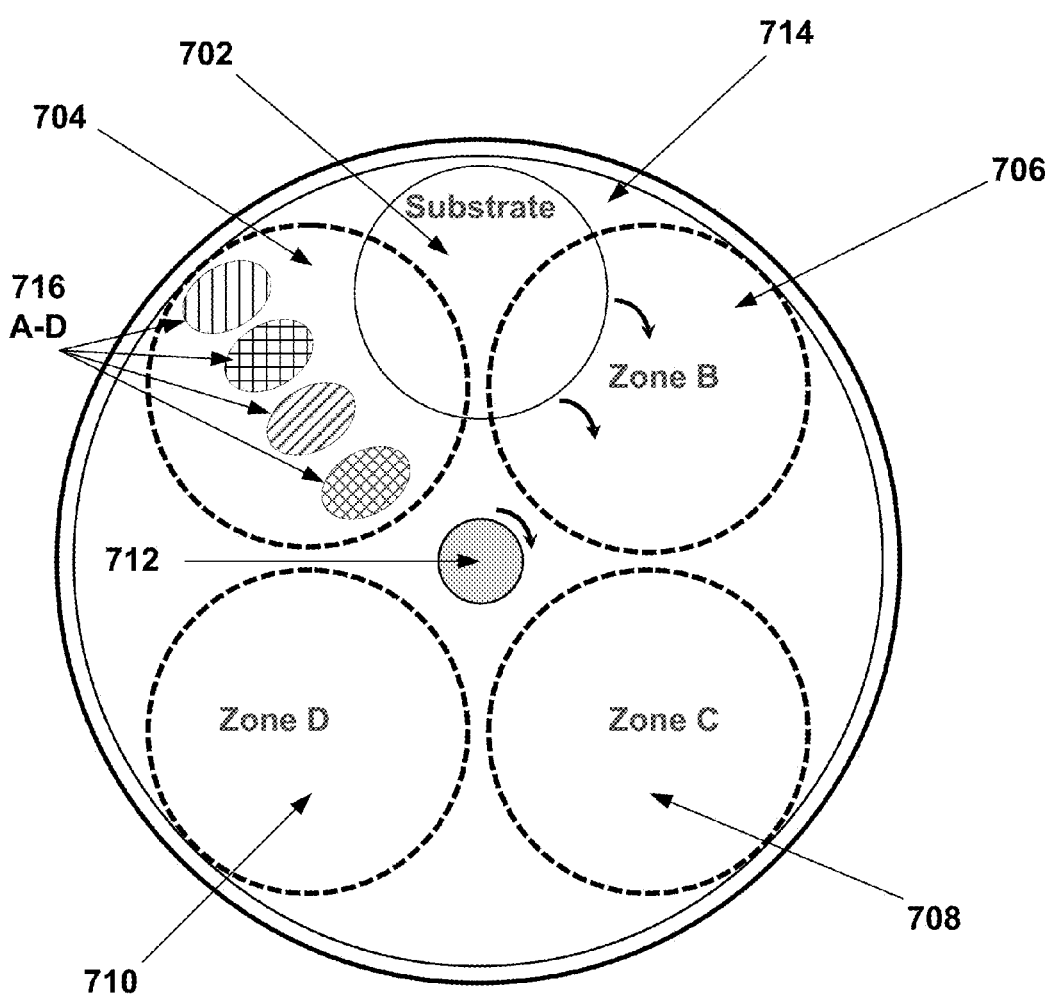
FIG. 7 illustrates a schematic diagram illustrating four processing regions, and example of a combinatorial configuration, and a substrate according to some embodiments.

FIG. 7 illustrates a schematic diagram illustrating four processing regions, and example of a combinatorial configuration, and a substrate according to some embodiments. FIG. 7 illustrates an adaptation of the system illustrated in FIG. 4 wherein one of the processing environments has been adapted to provide combinatorial processing of the substrates. The identification numbers for FIG. 7 correspond to similar items as described in FIG. 4 (i.e. substrate, 702, corresponds to substrate 402, etc.). For brevity, the complete description will not be repeated for items that are similar. Processing environment, 704, is illustrated as having four processing regions, 716A-716D that can be used to vary a set of processing parameters in a combinatorial manner. The configuration illustrated in FIG. 7 would result in the deposition of four materials on the substrate in a site isolated manner wherein each site isolated region would appear as an arc on the surface of the substrate. Examples of processing parameters that may be varied using the configuration illustrated in FIG. 7 comprise, gas flow composition (i.e. a different material may be deposited in each site isolate region), gas flow concentration (i.e. a similar material may be deposited in each site isolate region, but the concentration of the precursor may be varied by adjusting a ratio of the precursor to an inert carrier gas), the presence or absence of a surfactant, etc. This configuration is advantageous during the development of thin films using a surfactant as discussed previously. The benefits of the surfactant will be influenced by the relative surface coverage of the surfactant on the surface during the thin film deposition process. The relative surface coverage of the surfactant will be influenced by parameters such as temperature (a global process parameter—the same for all regions of the surface during a particular deposition), the pressure (a global process parameter), the flux of surfactant precursor to the surface, the time that the substrate is exposed in the processing environment, the composition of the surfactant, etc. When a surfactant is used, thin films may be formed using the techniques disclosed herein in a temperature range between about 200° C. and about 800° C., and advantageously between about 500° C. and about 800° C. Similarly, each of the processing regions, 716A-716D, can be used to vary the deposition parameters for the deposition of the thin film material.

Figure 8:
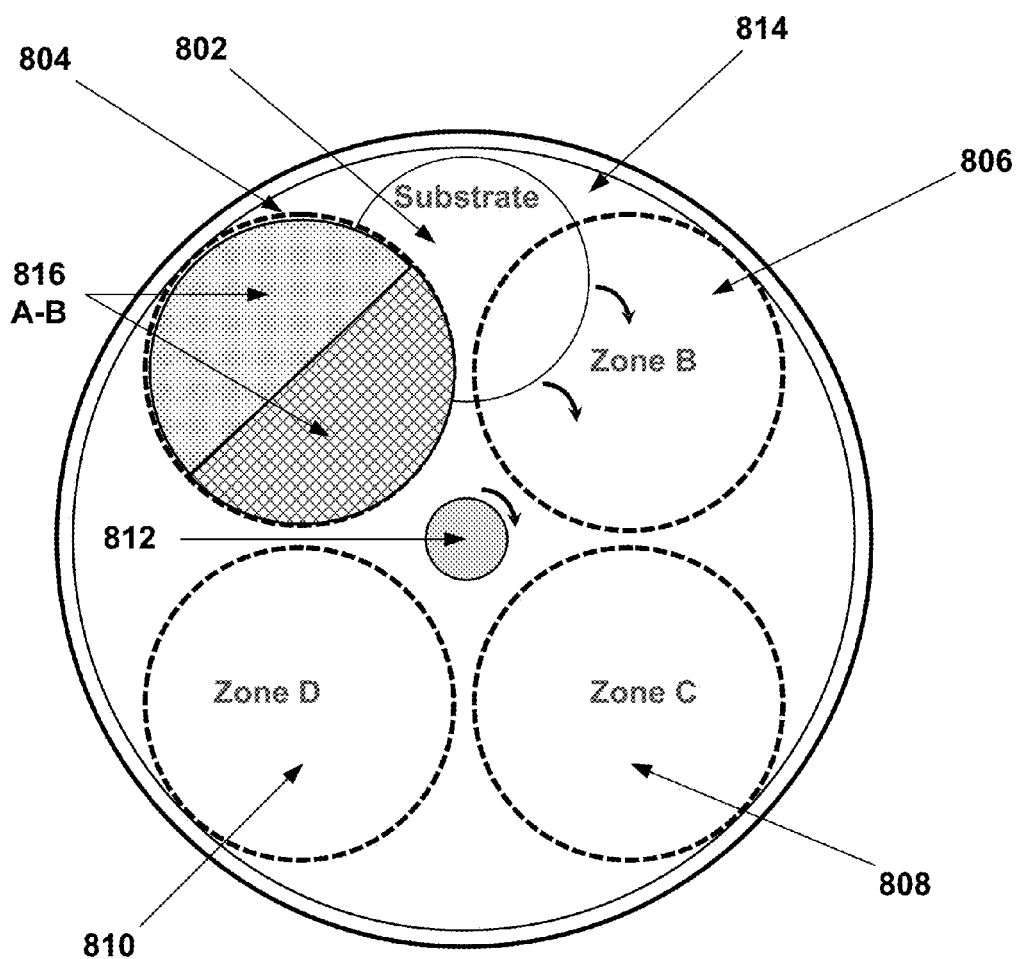
FIG. 8 illustrates a schematic diagram illustrating four processing regions, and example of a combinatorial configuration, and a substrate according to some embodiments.

FIG. 8 illustrates a schematic diagram illustrating four processing regions, and example of a combinatorial configuration, and a substrate according to some embodiments. FIG. 8 illustrates an adaptation of the system illustrated in FIG. 4 wherein one of the processing environments has been adapted to provide combinatorial processing of the substrates. The identification numbers for FIG. 8 correspond to similar items as described in FIG. 4 (i.e. substrate, 802, corresponds to substrate 402, etc.). For brevity, the complete description will not be repeated for items that are similar. Processing environment, 804, is illustrated as having two processing regions, 816A and 816B, that can be used to vary a set of processing parameters in a combinatorial manner. The configuration illustrated in FIG. 8 would result in the deposition of two materials on the substrate in a site isolated manner wherein each site isolated region would appear as an arc on the surface of the substrate. Examples of processing parameters that may be varied using the configuration illustrated in FIG. 8 comprise, gas flow composition (i.e. a different material may be deposited in each site isolate region), gas flow concentration (i.e. a similar material may be deposited in each site isolate region, but the concentration of the precursor may be varied by adjusting a ratio of the precursor to an inert carrier gas), the presence or absence of a surfactant, etc. This configuration is advantageous during the development of thin films using a surfactant as discussed previously. The benefits of the surfactant will be influenced by the relative surface coverage of the surfactant on the surface during the thin film deposition process. The relative surface coverage of the surfactant will be influenced by parameters such as temperature (a global process parameter—the same for all regions of the surface during a particular deposition), the pressure (a global process parameter), the flux of surfactant precursor to the surface, the time that the substrate is exposed in the processing environment, the composition of the surfactant, etc. When a surfactant is used, thin films may be formed using the techniques disclosed herein in a temperature range between about 200° C. and about 800° C., and advantageously between about 500° C. and about 800° C. Similarly, each of the deposition regions, 816A and 816B, can be used to vary the deposition parameters for the deposition of the thin film material.

Figure 9:
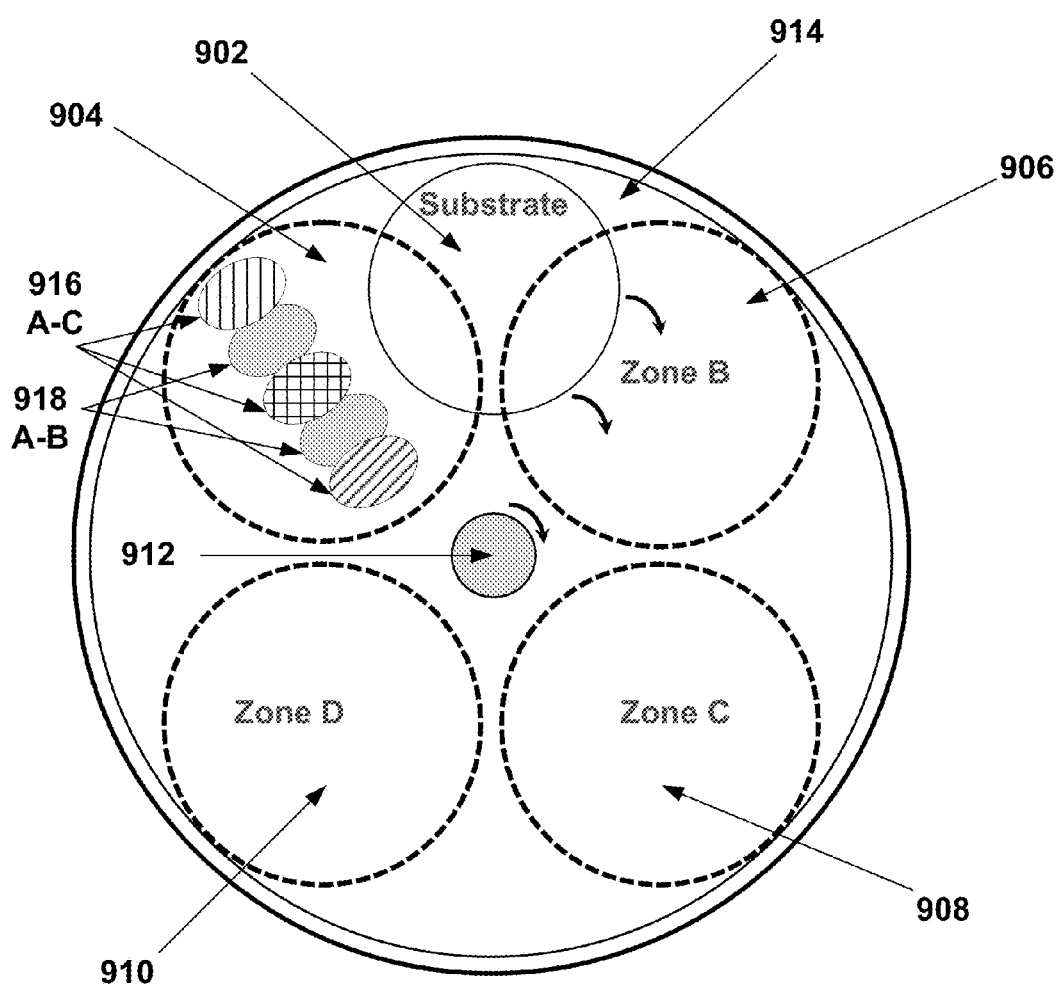
FIG. 9 illustrates a schematic diagram illustrating four processing regions, and example of a combinatorial configuration, and a substrate according to some embodiments.

FIG. 9 illustrates a schematic diagram illustrating four processing regions, and example of a combinatorial configuration, and a substrate according to some embodiments. FIG. 9 illustrates an adaptation of the system illustrated in FIG. 4 wherein one of the processing environments has been adapted to provide combinatorial processing of the substrates. The identification numbers for FIG. 9 correspond to similar items as described in FIG. 4 (i.e. substrate, 902, corresponds to substrate 402, etc.). For brevity, the complete description will not be repeated for items that are similar. Processing environment, 904, is illustrated as having three processing regions, 916A-916C that can be used to vary a set of processing parameters in a combinatorial manner, and two purge regions, 918A and 918B that can be used to improve the isolation between processing regions, 916A-916C. The configuration illustrated in FIG. 9 would result in the deposition of three materials on the substrate in a site isolated manner wherein each site isolated region would appear as an arc on the surface of the substrate. Examples of processing parameters that may be varied using the configuration illustrated in FIG. 9 comprise, gas flow composition (i.e. a different material may be deposited in each site isolate region), gas flow concentration (i.e. a similar material may be deposited in each site isolate region, but the concentration of the precursor may be varied by adjusting a ratio of the precursor to an inert carrier gas), the presence or absence of a surfactant, etc. This configuration is advantageous during the development of thin films using a surfactant as discussed previously. The benefits of the surfactant will be influenced by the relative surface coverage of the surfactant on the surface during the thin film deposition process. The relative surface coverage of the surfactant will be influenced by parameters such as temperature (a global process parameter—the same for all regions of the surface during a particular deposition), the pressure (a global process parameter), the flux of surfactant precursor to the surface, the time that the substrate is exposed in the processing environment, the composition of the surfactant, etc. When a surfactant is used, thin films may be formed using the techniques disclosed herein in a temperature range between about 200° C. and about 800° C., and advantageously between about 500° C. and about 800° C. Similarly, each of the deposition regions, 916A-916C, can be used to vary the deposition parameters for the deposition of the thin film material.

Although the foregoing examples have been described in some detail for purposes of clarity of understanding, the invention is not limited to the details provided. There are many alternative ways of implementing the invention. The disclosed examples are illustrative and not restrictive.

What is claimed:
1. A method for growing a film comprising:
a) providing a deposition chamber comprising a plurality of processing regions wherein the processing regions are not in fluid contact with one another;
b) exposing a substrate to one or more Group III precursors in a first processing region;
c) exposing the substrate to one or more surfactant precursors in a second processing region, wherein the exposure to one or more surfactant precursors forms a surfactant layer with thickness less than two monolayers;
d) exposing the substrate to one or more Group V precursors in a third processing region; and
repeating steps b) through d) until a desired thickness of the film is reached.
2. The method of claim 1 wherein the surfactant precursor comprises hydrogen, chlorine, bromine, iodine, arsenic, phosphorous, bismuth, indium, antimony, lead, tin, germanium, selenium, tellurium, magnesium, cadmium, zinc, mercury, or combinations thereof.
3. The method of claim 1 wherein the surfactant precursor comprises indium, antimony, or combinations thereof.
4. The method of claim 1 wherein the Group III precursor gases include one or more of Al-containing gases, Ga-containing, In-containing gases, or combinations thereof.
5. The method of claim 1 wherein the Group V precursor comprises a nitrogen-containing species.
6. The method of claim 5 wherein the nitrogen-containing species comprises active neutral species of nitrogen.
7. The method of claim 6 wherein the active neutral species of nitrogen comprises nitrogen species having the lowest excited state of molecular nitrogen ($A^3\Sigma_u^+$).
8. The method of claim 1 wherein the growth of the film occurs at between about 25° C. and about 800° C.
9. The method of claim 1 wherein the growth of the film occurs at between about 500° C. and about 800° C.
10. The method of claim 1 wherein the film is one of AlN, GaN, InN, AlGaN, AlInN, InGaN, or InGaAlN.
11. The method of claim 1 wherein an exposure dosage of the one or more precursor gases in each of step b), step c), and step d) is influenced by the rotation speed of a rotating substrate support.
12. The method of claim 1 wherein the thickness of the film after a single sequence of steps b) through d) is less than one monolayer.
13. The method of claim 1 wherein the thickness of the film after a single sequence of steps b) through d) is greater than or equal to one monolayer.
14. The method of claim 1 further comprising exposing the substrate to a hydrogen plasma before step d).
15. The method of claim 1 further comprising exposing the substrate to a hydrogen plasma after step d).
16. The method of claim 1 wherein the exposure to one or more surfactant precursors forms a surfactant layer with thickness greater than or equal to one monolayer.
17. The method of claim 1 further comprising measuring one or more film properties of the thin film formed on the substrate in a fourth reaction region.
18. The method of claim 1 further comprising measuring one or more film properties of the surfactant layer formed on the substrate in a fourth reaction region.

19. The method of claim 1 wherein the first reaction region and the second reaction region are the same reaction region.

* * * * *